United States Patent
Poedjono et al.

(10) Patent No.: US 7,599,797 B2
(45) Date of Patent: Oct. 6, 2009

(54) METHOD OF MITIGATING RISK OF WELL COLLISION IN A FIELD

(75) Inventors: Benny Poedjono, Sugar Land, TX (US); Tamara San Antonio, Anzoategui (VE)

(73) Assignee: Schlumberger Technology Corporation, Sugar Land, TX (US)

( * ) Notice: Subject to any disclaimer, the term of this patent is extended or adjusted under 35 U.S.C. 154(b) by 123 days.

(21) Appl. No.: 11/350,655

(22) Filed: Feb. 9, 2006

(65) Prior Publication Data

US 2007/0203648 A1 Aug. 30, 2007

(51) Int. Cl.
G08G 1/16 (2006.01)

(52) U.S. Cl. .......................... 701/301; 701/302; 175/45; 175/61; 175/62; 324/346; 33/304; 702/7; 702/9; 166/245

(58) Field of Classification Search ......... 701/300–302; 175/45
See application file for complete search history.

(56) References Cited

U.S. PATENT DOCUMENTS

| | | | | |
|---|---|---|---|---|
| 4,794,534 A * | 12/1988 | Millheim | .......................... | 702/9 |
| 4,957,172 A * | 9/1990 | Patton et al. | .................. | 175/61 |
| 5,103,920 A * | 4/1992 | Patton | .......................... | 175/45 |
| 5,589,775 A * | 12/1996 | Kuckes | .......................... | 324/346 |
| 5,901,795 A * | 5/1999 | Tsao et al. | .................... | 175/45 |
| 6,021,377 A | 2/2000 | Dubinsky et al. | | |
| 6,109,368 A | 8/2000 | Goldman et al. | | |
| 6,152,246 A | 11/2000 | King et al. | | |
| 6,282,452 B1 | 8/2001 | DeGuzman et al. | | |
| 6,408,953 B1 | 6/2002 | Goldman et al. | | |
| 6,842,699 B2 * | 1/2005 | Estes | .............................. | 702/9 |
| 6,985,814 B2 * | 1/2006 | McElhinney | .................... | 702/7 |
| 2003/0014873 A1 * | 1/2003 | Towle | .......................... | 33/304 |
| 2004/0000430 A1 * | 1/2004 | King | .......................... | 175/24 |
| 2004/0160223 A1 * | 8/2004 | McElhinney | .................... | 324/346 |
| 2004/0163443 A1 * | 8/2004 | McElhinney | ................ | 73/1.79 |
| 2004/0182606 A1 | 9/2004 | Goldman et al. | | |
| 2004/0243309 A1 * | 12/2004 | Alft et al. | ...................... | 702/9 |
| 2006/0004701 A1 * | 1/2006 | Bacon | ............................. | 707/2 |
| 2006/0026017 A1 * | 2/2006 | Walker | .......................... | 705/1 |
| 2006/0190178 A1 * | 8/2006 | Zamora et al. | ................. | 702/9 |

* cited by examiner

*Primary Examiner*—Khoi Tran
*Assistant Examiner*—Jonathan Sample
(74) *Attorney, Agent, or Firm*—Darla Fonseca; Brigitte Echols; Dale Gaudier (57) ABSTRACT

A method and system for mitigating risk of well collision in a field includes receiving an anti-collision standard exemption request containing a description of risk of collision between a subject well and one or more offset wells, generating an assessment of the anti-collision standard exemption request using a stored multidimensional decision matrix, reviewing the assessment, and selectively updating the decision matrix based on the review.

4 Claims, 6 Drawing Sheets

METHOD OF MITIGATING RISK OF WELL COLLISION IN A FIELD

BACKGROUND OF THE INVENTION

1. Field of the Invention

The invention relates generally to methods for planning and drilling wells.

2. Background Art

For every well drilled in a given field, the objective is to intersect a potential successful. As the number of wells in the field increases, the possibility of the well being drilled (subject well) colliding with neighboring wells (offset wells) in the field increases. Catastrophic events, which may lead to injury to and/or loss of human life, can accompany well collision. Therefore, it is imperative that the risk of well collision is minimized.

Traditionally, methods for minimizing risk of well collision involve optimizing design of the subject well such that a minimum separation distance exists between the subject well and offset wells. However, even if the subject well is designed such that a minimum separation distance exists between the subject well and the offset wells, there may still be a risk of well collision due to uncertainties in the survey data for the offset wells. Thus, a detailed and continuously updated drilling plan is needed to minimize the risk of well collision through the course of drilling the subject well.

During planning and drilling of a subject well, an anti-collision scan is run on the well design to determine if there is a risk of well collision. Risk of well collision may be expressed in terms of minimum separation distance between the subject well and offset wells. If there is a risk of well collision, a request is made for an anti-collision standard exemption. If the request is granted, then the well can be drilled according to the conditions stated in the grant. Depending on the congestion level in the field, numerous anti-collision standard exemption requests may be filed during planning and drilling of a single well.

Each processing of an anti-collision standard exemption request requires gathering of data from offset wells, followed by analysis of the data by a professional to design a safe and drillable well. The data gathering and analysis are laborious, often requiring extensive manual input, hence subject to human error. The data and analysis related to processing of anti-collision standard exemption requests for one well is typically not applied to processing of anti-collision standard exemption requests for the next well in the same field. As a result, mitigation of risk of collision of the next well is just as laborious as for the previous well.

From the foregoing, a more efficient process of mitigating risk of well collision in a field is desired.

SUMMARY OF THE INVENTION

In one aspect, the invention relates to a method of mitigating risk of well collision in a field which comprises receiving an anti-collision standard exemption request containing a description of risk of collision between a subject well and one or more offset wells, generating an assessment of the anti-collision standard exemption request using a multidimensional decision matrix, reviewing the assessment, and selectively updating the decision matrix based on the review.

In another aspect, the invention relates to a system for mitigating risk of well collision which comprises a multidimensional decision matrix comprising actions to prevent likelihood of risk of collision and/or actions to mitigate risk of collision and a tool which receives an anti-collision standard exemption request and generates an assessment of the anti-collision standard exemption request using the multidimensional matrix, wherein the anti-collision standard exemption request comprises a description of risk of collision between a subject well and one or more offset wells.

In another aspect, the invention relates to a system for mitigating risk of well collision which comprises a media containing a program which when executed receives an anti-collision standard exemption request and accesses a multidimensional decision matrix to generate an assessment of the anti-collision standard exemption request, wherein the anti-collision standard exemption request comprises a description of risk of collision between a subject well and one or more offset wells, wherein the multidimensional decision matrix comprises actions to prevent likelihood of risk of collision and/or actions to mitigate risk of collision.

Other features and advantages of the invention will be apparent from the following description and the appended claims.

DETAILED DESCRIPTION OF EMBODIMENTS

The invention will now be described in detail with reference to a few preferred embodiments, as illustrated in accompanying drawings. In the following description, numerous specific details are set forth in order to provide a thorough understanding of the invention. However, it will be apparent to one skilled in the art that the invention may be practiced without some or all of these specific details. In other instances, well-known features and/or process steps have not been described in detail in order to not unnecessarily obscure the invention. The features and advantages of the invention may be better understood with reference to the drawings and discussions that follow.

Figure 1:
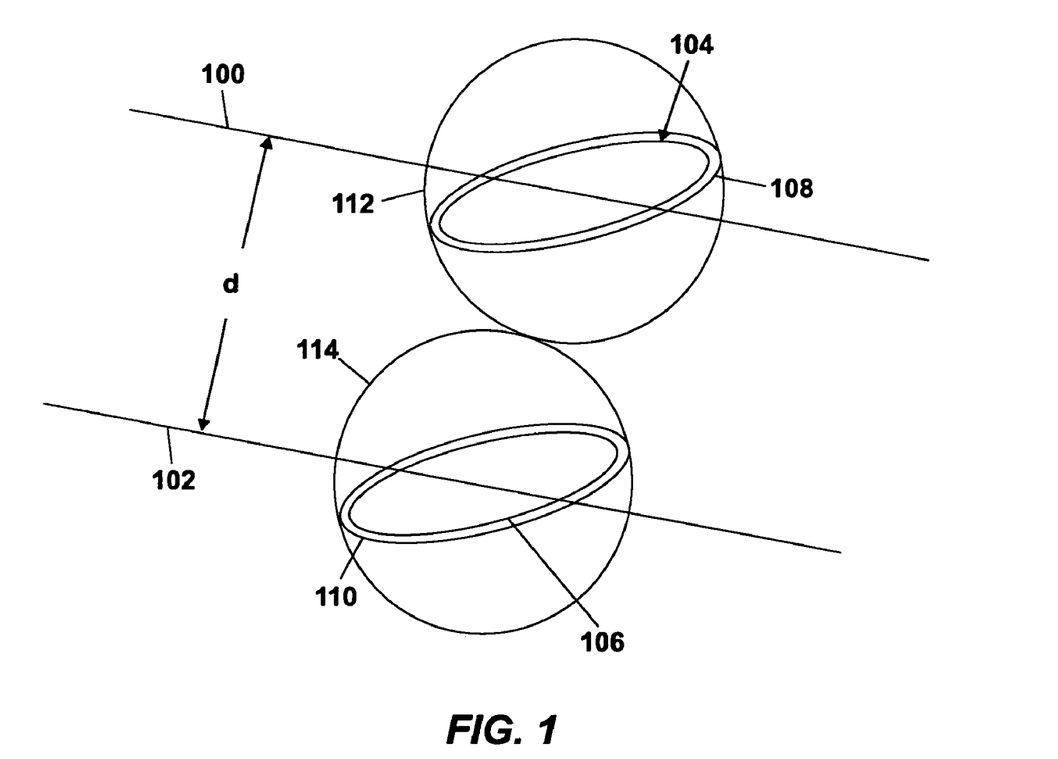
FIG. 1 illustrates a definition of separation factor for two nearby wells.

A method of mitigating risk of well collision includes running one or more anti-collision scans during the course of planning and/or drilling a subject well. The anti-collision scan helps to determine if and where along the subject well an anti-collision standard is violated. The term "anti-collision standard," as used herein, refers to a set of rules that apply globally and contain a detailed explanation of the survey-related requirements to be fulfilled in the well design and drilling process. The anti-collision standard may vary from one drilling project to the next, but in general, the standard is intended to avoid collision between the subject well and offset wells. For example, an anti-collision standard may be based on separation factor (SF) and/or center-to-center distance between the subject well and offset well. SF is a measure of the separation distance between the subject well and offset well based on intersection of ellipses normal to the trajectories of the subject well and offset well. In FIG. 1, SF is defined as the center-to-center distance (d) between two nearby wells 100, 102 divided by the major semi-axis radii of the ellipsoids of uncertainty 104, 106 associated with the wells 100, 102, respectively. The ellipsoids 108, 110 include allowances for hole radii of the wells 100, 102, respectively. The major semi-axis and hole radii are projected into spheres 112, 114.

Running of the one or more anti-collision scans includes generating one or more anti-collision reports. An anti-collision report includes depths along the subject well where the anti-collision standard is violated. For example, if the anti-collision standard is SF <1.5, then depths where SF between the subject well and offset well(s) is less than 1.5 are reported. At each depth where there is a risk of collision with one or more offset wells, e.g., where SF <1.5, an anti-collision standard exemption request is made. If the request is granted, then the well can be drilled, but with modifications to the drilling plan. If the request is not granted, the well should not be drilled. Since there are uncertainties in data of offset wells, the method includes checking the integrity of survey data where an anti-collision standard is violated before recommending modifications to the drilling plan.

Figure 2:
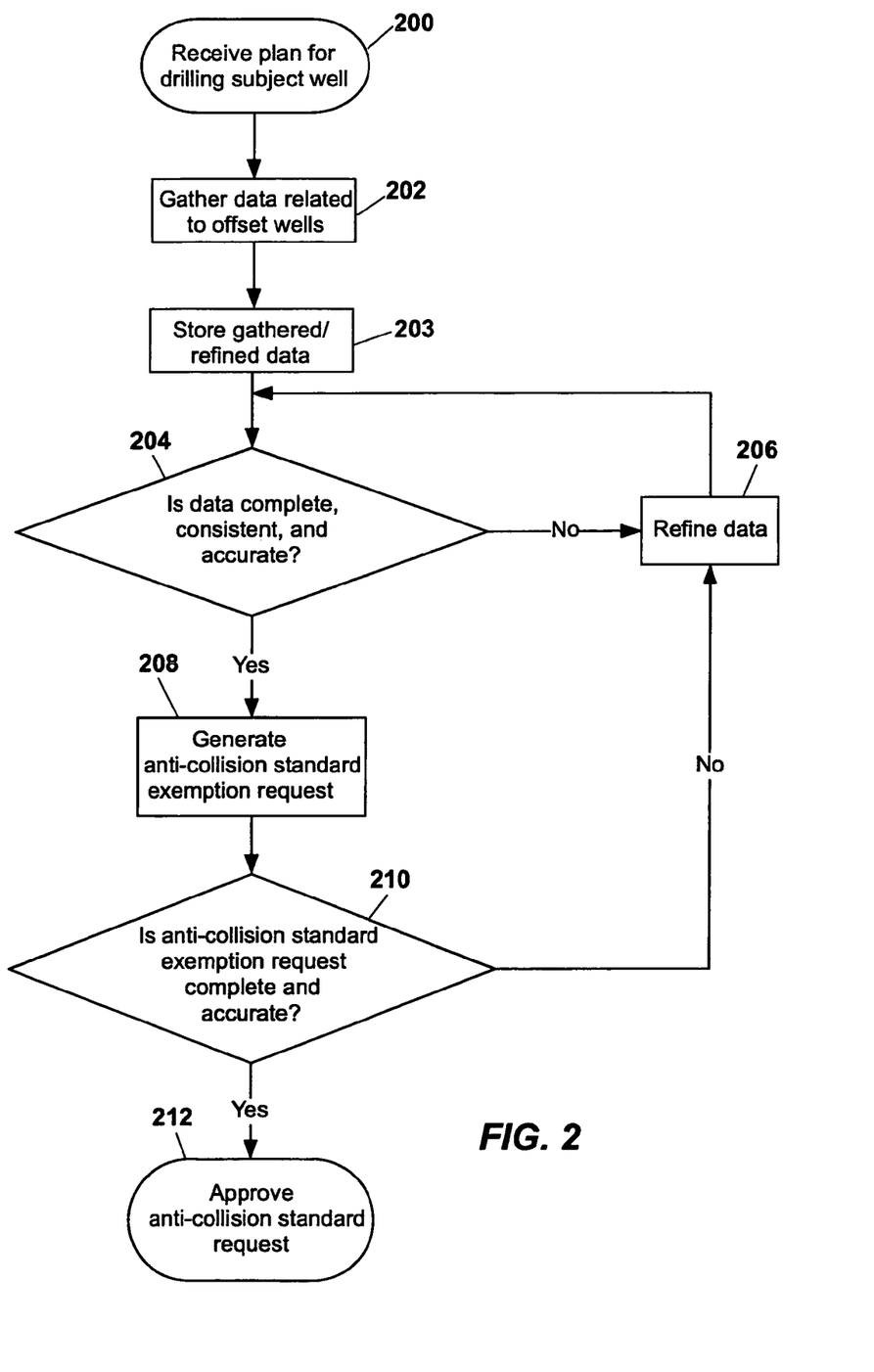
FIG. 2 illustrates a process for generating an anti-collision standard exemption request.

FIG. 2 illustrates a process for generating an anti-collision standard exemption request. The process may be carried out with the aid of a computer system. The process includes receiving a plan for drilling the subject well (200). The drilling plan includes a planned trajectory, which is a geometrical representation in three-dimensions of the well path that describes the directions in which the well should go to achieve its objective, i.e., intersect a desired target. The process includes gathering data related to offset wells in the field (202). The offset wells may be nearby wells, multiple wells from a drilling platform and/or multiple wells from a common land pad. The data includes surveys (measured depth, inclination and azimuth), survey tool type, surface and bottomhole location, the target to be drilled into, and the reservoir and drilling properties. The target in this instance is the plan view of the circular limit acceptable to the operator of the project. These data may be gathered from a single source or may be gathered from disparate sources. The process included storing the data in a central database (203).

The process further includes quality check of the data stored in the central database for completeness, consistency, and accuracy (204). Questions that may be asked during the quality check include, but are not limited to, is the client, field name, and project identifier consistent throughout the data and does the survey data match the survey tool type? If the data is not complete, consistent, or accurate, the data is refined (206). This may include gathering more data or correcting data already gathered. Then, the quality check of the data is checked again (204). Updates made to the data are stored so that it is not necessary to repeat the same data refinement for future generation of anti-collision standard exemption requests (203).

If the data stored and/or updated in step 203 is complete, consistent, and accurate, an anti-collision standard exemption request is generated using the data (208). The process includes quality check and assurance of the anti-collision standard exemption request, i.e., whether the anti-collision standard exemption request is complete and accurate (210). If there is any missing or questionable information in the request, the process returns to step 206, where the input data is corrected and/or additional data is gathered. If the anti-collision standard exemption request is complete and accurate, the request is approved for processing (212).

Figure 3:
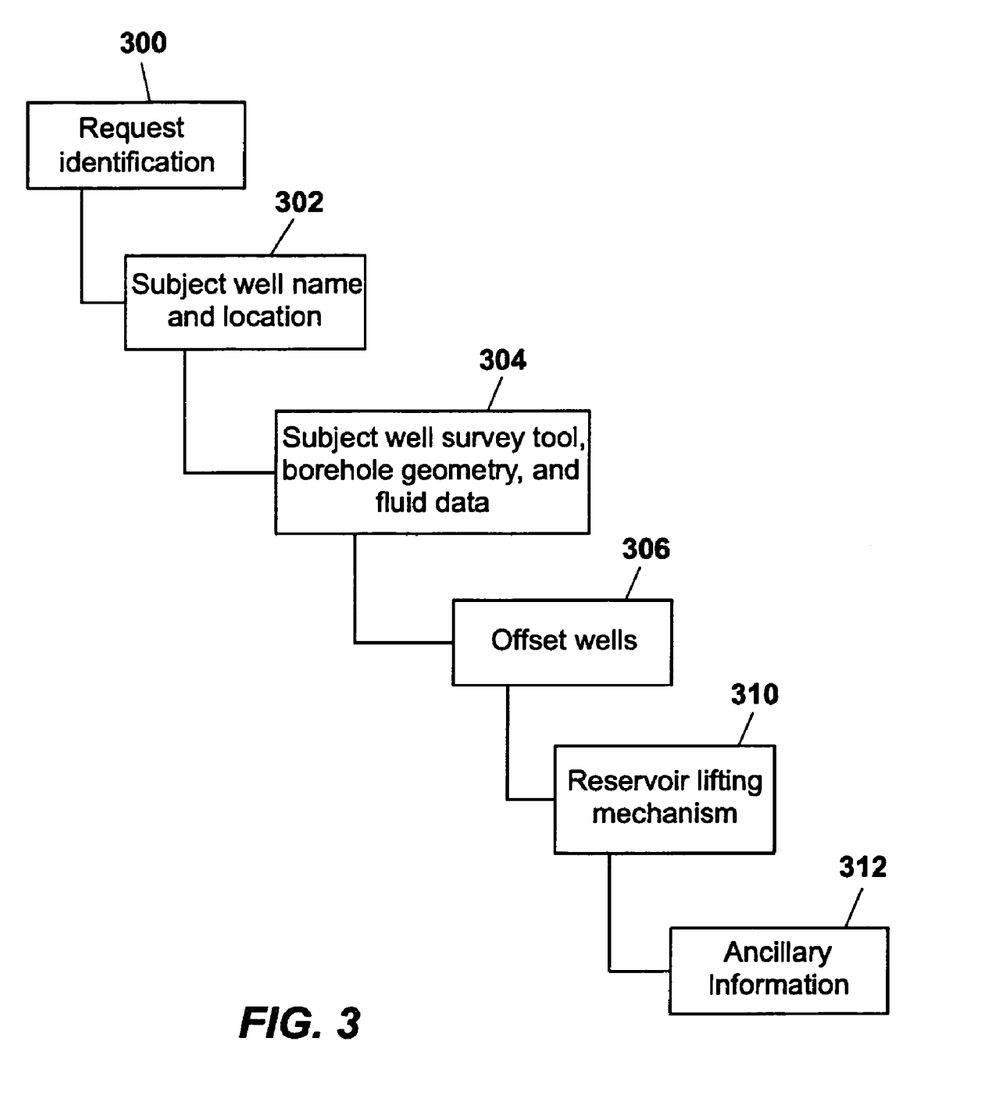
FIG. 3 is a block diagram of an anti-collision standard exemption request.

FIG. 3 shows one example of an anti-collision standard exemption request. This example request includes several sections. A section 300 may include basic information about the request, such as an identifier for the request, the request date, the date the exemption is required, originator of the request, the geographical market, the owner of the subject well, the name of the subject well, the name of the field in which the subject well is located, the job number, and so forth. A section 302 may include detailed identification of the subject well, e.g., the well name, well type, well profile, surface coordinates, rig, rig type, total depth, and so forth. A section 304 may include detailed information about the downhole tool (e.g., See FIG. 7), borehole geometry and mud property as a function of depth of the subject well. A section 306 may include detailed information about offset wells at risk of colliding with the subject well as a function of depth of the subject well. This section may indicate severity of the risk, e.g., whether the risk is major or minor, based on anti-collision standard. For example, if SF <1, the risk may be classified as major, and if 1<SF <1.5, the risk may be classified as minor. A section 308 may include the type of reservoir lifting to be used in producing the subject well, e.g., natural flow, sucker rod, gas lift, and so forth. A section 312 may include links to ancillary information, such as anti-collision report, brief explanation of the risk situation, a statement of actions taken at the well design stage to mitigate well collision, an assessment of worst case scenario that would result from a well collision.

Figure 4:
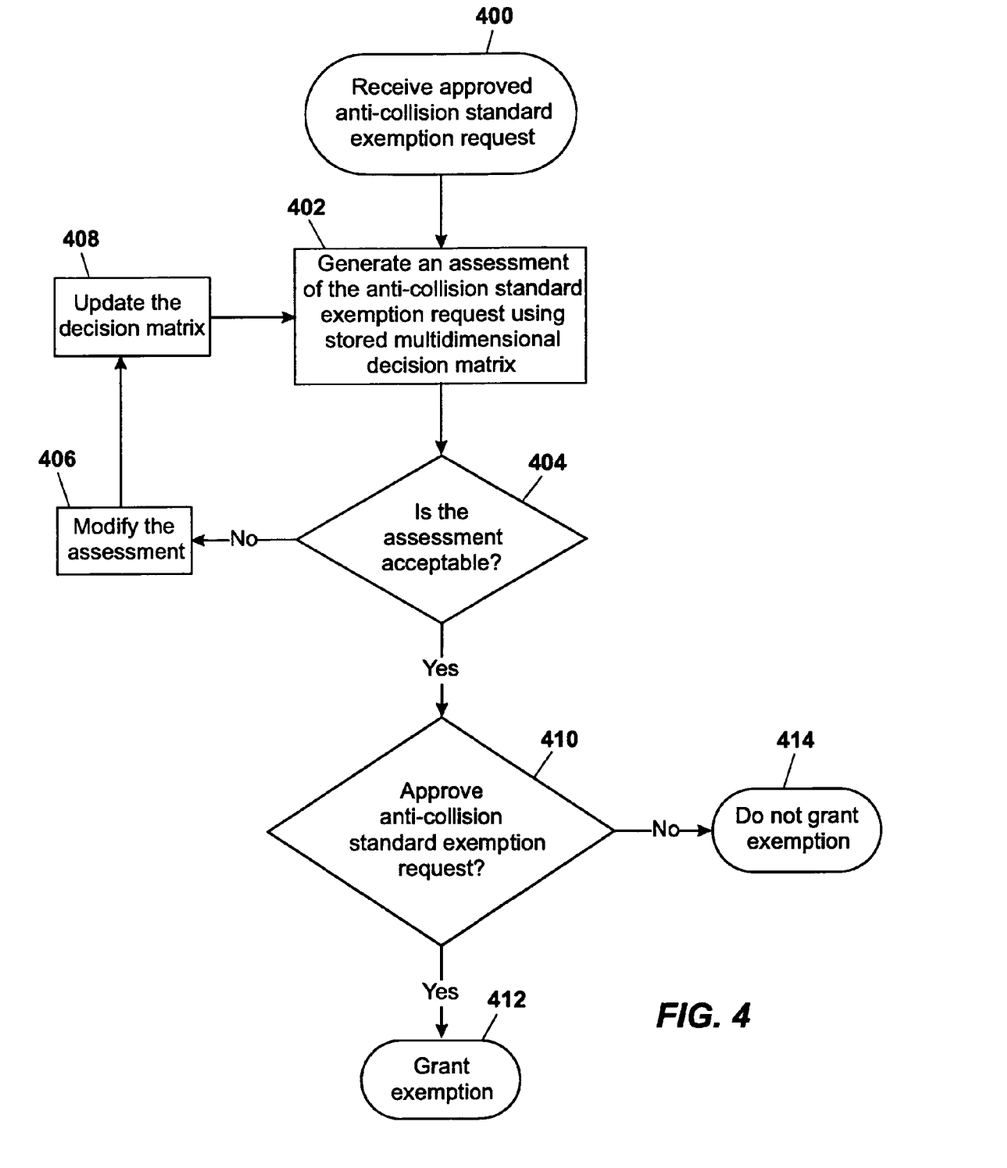
FIG. 4 illustrates a method of processing an anti-collision standard exemption request.
Figure 5:
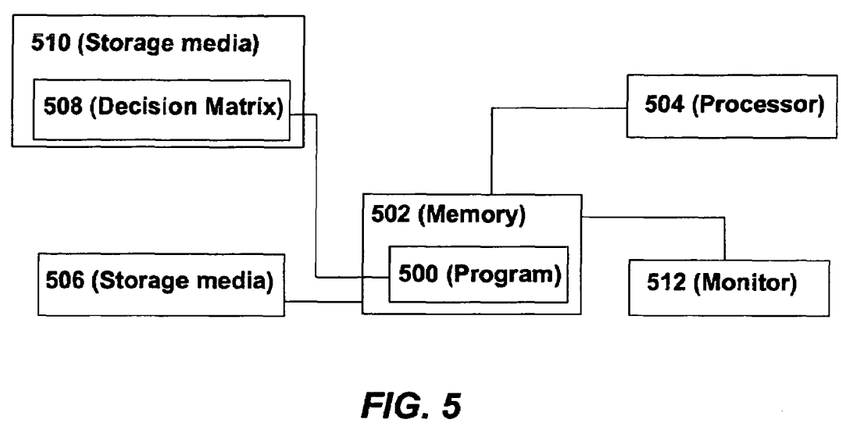
FIG. 5 illustrates a computer system suitable for processing an anti-collision standard exemption request.

FIG. 4 shows a method of processing an anti-collision standard exemption request. The method starts by receiving an approved anti-collision exemption request (400). The approved anti-collision exemption request may be one generated using the process described above, or may be from another source. An assessment of the anti-collision exemption request (402) is generated using a decision matrix stored in an appropriate database. Referring to FIG. 5, automatic generation of the assessment may be accomplished by loading a program 500 which performs the assessment into memory 502 and executing the program using a processor 504. The assessment program 500 may initially reside on a storage media 506, such as a hard disk or CD-ROM, and may be loaded into memory 502 as needed therefrom. During execution, the program 500 accesses the decision matrix 508 from a storage media 510. The storage media 506 and 510 may be the same component or may be separate components. The results of the assessment program 500 may be displayed on a computer monitor 512.

Figure 6:
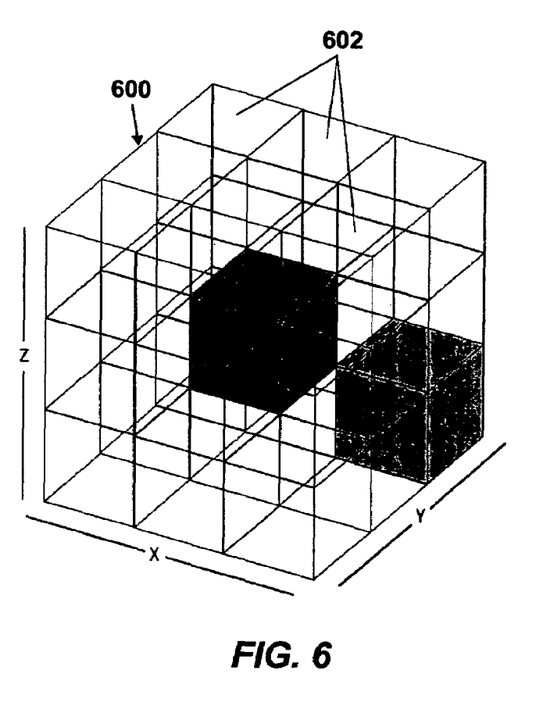
FIG. 6 is a graphical illustration of a multidimensional decision matrix.

The decision matrix is a multi-dimensional matrix. It includes at least two dimensions. In a preferred embodiment, it includes at least three dimensions. Each dimension of the decision matrix can be characterized by one or more parameters. The parameters of each dimension of the decision matrix can be as varied as desired and may be single-valued or multi-valued FIG. 6 shows a graphical representation of a decision matrix 600. In this example, the decision matrix has three dimensions labeled X, Y, and Z. As an example, the parameters of dimension X may be center-to-center distances, SF, and surface rules. As a further example, the parameters of dimension Y may be mud weight, hydrostatic pressures, collision depth, and reservoir pressure. As a further example, the parameters of dimension Z may be magnetic scan, survey program, and completion type. Each cell 602 in the decision matrix has a set of actions. Which cell of the decision matrix is triggered during assessment of an anti-collision standard exemption request depends on the values for the parameters along the X, Y, Z dimensions for the subject well described in the anti-collision standard exemption request. The actions in each cell may include one or more actions, which are measures taken at the well site or during drilling to manage the likelihood of the event controlling the risk of collision and/or to reduce or eliminate the potential risk of collision. These actions may be taken during design of the drilling plan and/or during execution of the drilling plan.

The following examples are presented to further illustrate how the decision matrix works. The examples are not intended to limit the invention as otherwise described herein.

EXAMPLE 1

Suppose that the subject well is a directional well that has proximity with an offset well with a SF <1.5 and center-to-center distance of 30 ft (9.75 m) at measured depth of 3000 ft (914.4 m) and true vertical depth of 2500 ft (762 m). The mud weight to be used in the collision area is that to contain the formation been drilled under normal conditions. The offset well pressure is low due to well lifting mechanism (electric submergible pump—medium low pressure reservoir). Magnetic scan reports interference which must be accounted for the survey program. As a result the mud weight pressure will be higher than the well pressure. Thus, the risk of a collision reduces to financial concerns only. This assessment will trigger preventing actions at the well site to manage the likelihood of the event controlling the residual risk.

EXAMPLE 2

Suppose that the subject well is a directional well that has proximity with an offset well with a SF <1.5 and center-to-center distance of 32 ft (9.75 m) at a measured depth of 5000 ft (1524 m) and a true vertical depth of 3000 ft (914.4 m). The mud weight to be used in the collision area is that to contain the formation been drilled under normal conditions. The offset well pressure is high due to well lifting mechanism (gas lift—medium low pressure reservoir). Magnetic scan reports interference, which must be accounted for in the survey program. As a result, the mud weight pressure will be lower than the well pressure. In the event of a collision the risk is high to personnel and equipment. This assessment will trigger mitigations measures to reduce (or eliminate) the potential risk and also preventing actions at well site to manage the likelihood of the event controlling the residual risk.

In one embodiment, the multi-dimensional decision matrix also contains process paths that provide guidance to reassess the input data, e.g., survey-related data, that may be of concern. For example, if the well being drilled outside the guidelines is based on SF <1.5 and/or center-to-center distances, the anti-collision report will indicate such. If this occurs, the quality of the data used in generating SF and/or center-to-center distances for the subject well and offset wells are verified before continuing assessment of the anti-collision exemption request. As a result of the steps in gathering and performing quality control and assurance on the input data, the input data used in generating the anti-collision standard exemption request becomes increasingly refined and reliable.

The assessment of the anti-collision standard exemption request may include a brief description of what rule from the standard is being broken or why the exemption request is needed. The assessment may include a summary of the offset wells at risk of colliding with the subject well and the status of the offset wells, e.g., whether the offset well is active, inactive, natural flow, abandoned, and so forth. The assessment may also include a summary of the risks if well collision occurs, including an indication whether the well collision would be major or minor. The assessment includes conditions under which the exemption can be approved. These conditions are the set of actions determined from the decision matrix. The assessment may have one or more objectives. One example of an objective is to minimize risk to human life and the environment of well collision occurs.

Returning to FIG. 4, after generating an assessment of the anti-collision standard exemption request, a professional reviews the assessment. The professional checks whether the assessment is acceptable (404) based on the request. If the assessment is not acceptable, the professional makes modifications to the assessment (406) and updates the decision matrix based on the modifications to the assessment (408). The process of updating the decision matrix may include, for example, displaying the decision matrix on the computer monitor and with the aid of an input device modifying the desired components of the decision matrix. Alternately, a program which can modify the decision matrix based on user inputs can be executed. After updating the decision matrix (408), an assessment of the anti-collision standard exemption request is regenerated using the updated decision matrix (402). The assessment is then checked for acceptability (404). If the assessment is acceptable, the anti-collision standard exemption request is then examined for approval based on the assessment (410). If the anti-collision exemption is approved, an exemption grant is issued (412). Otherwise, the request is returned to the originator without granting (414).

The process of the invention is designed to optimize any and all data through a learning process. This process determines the quality of the input data based on the proposed path of the subject well and specifies adjustments to the further drilling plan as needed. These adjustments are guided by the creation of an anti-collision multidimensional decision matrix. The multidimensional decision matrix includes process paths that provided guidance for reassessing the input data that may be questionable. As a result of the steps in gathering and performing quality check and assurance on the input data, the input data becomes increasingly refined and reliable. The need to repeat the process of refining input data each time a new well is to be drilled is therefore minimized.

Figure 7:
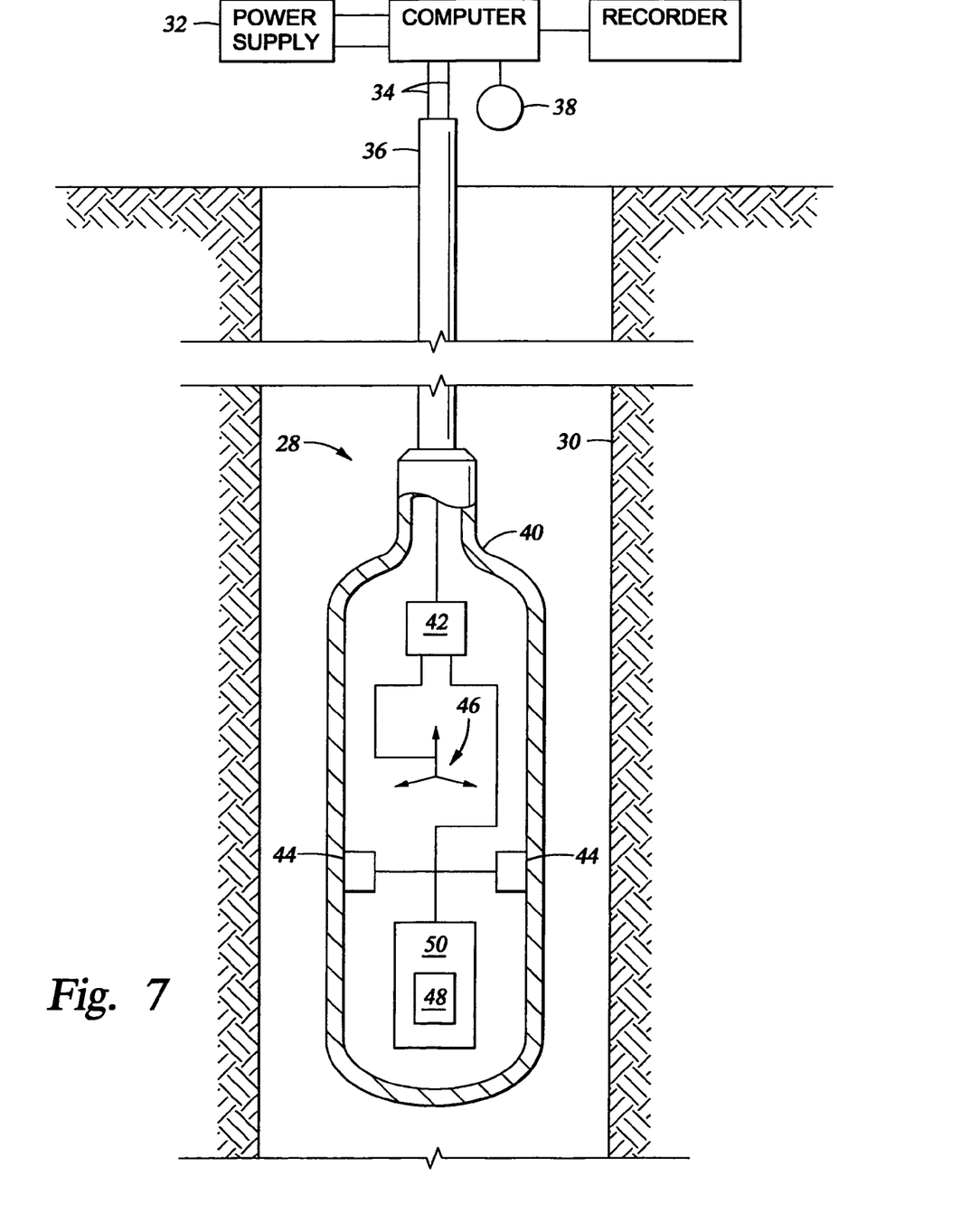
FIG. 7 shows a logging system including a downhole tool and computer arrangement in accord with the invention.

FIG. 7 shows a system embodying an implementation of the invention. Microprocessor 48 is shown mounted in a downhole logging tool 28 disposed in a borehole 30 that penetrates an earth formation. Microprocessor 48 is housed within a conventional thermally insulated chamber 50 to protect it from exposure to excessive temperature changes. The tool 28 also includes a multi-axial electromagnetic antenna 19, a conventional source/sensor 44 array for subsurface measurements (e.g., nuclear, acoustic, gravity), and electronics 42 with appropriate circuitry. The tool 28 is shown disposed in the borehole 30 as part of a drill string 36 typically used in drilling operations. Downhole electronics 42 are coupled with the surface equipment 32 for signal and control communication using conventional telemetry means, which can include the use of "wired" drill pipes and acoustic or electromagnetic telemetry means known in the art. Signals may be processed or recorded in the tool 28 and the processed data transmitted to the surface equipment 32.

It will also be apparent to those skilled in the art that this invention may be implemented by programming on or more suitable general-purpose microprocessors, such as shown in FIG. 5. The programming may be accomplished through the use of one or more program storage devices readable by the processor and encoding one or more programs of instructions executable by the processor for performing the operations described above. The program storage device may take the form of, e.g., one or more floppy disks; a CD ROM or other optical disk; a magnetic tape; a read-only memory chip (ROM); and other forms of the kind well-known in the art or subsequently developed. The program of instructions may be "object code," i.e., in binary form that is executable more-or-less directly by the processor; in "source code" that requires compilation or interpretation before execution; or in some intermediate form such as partially compiled code. The precise forms of the program storage device and of the encoding of instructions are immaterial here. Thus these processing means may be implemented in the surface equipment 32, in the tool 48, or shared by the two as known in the art.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method of mitigating risk of subsurface well collision, comprising:

obtaining a survey of a field wherein a subject well is to be drilled;

running an anti-collision scan while planning or drilling the subject well to determine if a requirement to be fulfilled in the process of drilling the subject well is violated, the requirement being based on the field survey to avoid collision between the subject well and offset wells in the field;

generating an anti-collision report indicating if and where along the subject well the requirement to be fulfilled in the process of drilling the subject well is violated;

generating a request for an exemption to the requirement that is violated, the request indicating a severity of the risk of collision between the subject well and an offset well from minor to major risk;

assessing the exemption request using a three-dimensional matrix, the dimensions including parameters comprising a center-to-center distance, a separation factor, a surface rule, a mud weight, a hydrostatic pressure, a collision depth, a reservoir pressure, a magnetic scan, a survey program, or a completion type;

deriving a cell within the matrix during assessment of the exemption request based on values for the parameters of the matrix dimensions for the subject well included in the exemption request; and generating a visual display of the exemption request assessment results to determine if action is required to manage the likelihood of an event controlling a risk of collision or to reduce or eliminate the potential risk of collision between the subject well and an offset well based on a set of actions in the derived matrix cell.

2. The method of claim 1, wherein the three-dimensional matrix further comprises at least one process path providing guidance for quality control of parameter values input to the matrix.

3. The method of claim 1, further comprising updating a three-dimensional matrix parameter value after assessing the exemption request.

4. The method of claim 3, further comprising re-assessing the exemption request after updating the three-dimensional matrix parameter value.

* * * * *